(12) United States Patent
Kurokawa et al.

(10) Patent No.: US 8,803,063 B2
(45) Date of Patent: Aug. 12, 2014

(54) PHOTODETECTOR CIRCUIT

(75) Inventors: Yoshiyuki Kurokawa, Kanagawa (JP); Takayuki Ikeda, Kanagawa (JP); Hikaru Tamura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 364 days.

(21) Appl. No.: 13/024,391

(22) Filed: Feb. 10, 2011

(65) Prior Publication Data

US 2011/0204207 A1    Aug. 25, 2011

(30) Foreign Application Priority Data

Feb. 19, 2010  (JP) ................................. 2010-034156

(51) Int. Cl.
*H01L 27/146* (2006.01)
(52) U.S. Cl.
USPC ..................................................... 250/214 R
(58) Field of Classification Search
CPC ............................... H01L 31/12; H04N 5/335
USPC ........ 250/214 R, 214.1, 208.1; 257/290–292; 349/151–152
See application file for complete search history.

(56) References Cited

U.S. PATENT DOCUMENTS

| | | | |
|---|---|---|---|
| 6,747,638 B2 | 6/2004 | Yamazaki et al. | |
| 7,978,297 B2 * | 7/2011 | Kimura et al. | ................ 349/152 |
| 8,124,924 B2 | 2/2012 | Yanagisawa et al. | |
| 8,586,905 B2 | 11/2013 | Kurokawa | |
| 8,610,696 B2 | 12/2013 | Kurokawa | |
| 2010/0134735 A1 | 6/2010 | Nakamura et al. | |
| 2011/0109591 A1 | 5/2011 | Kurokawa et al. | |
| 2011/0109592 A1 | 5/2011 | Kurokawa et al. | |
| 2011/0148835 A1 | 6/2011 | Yamazaki | |
| 2011/0175833 A1 | 7/2011 | Kurokawa et al. | |
| 2011/0176038 A1 | 7/2011 | Kurokawa et al. | |

FOREIGN PATENT DOCUMENTS

JP       2001-292276 A     10/2001

* cited by examiner

*Primary Examiner* — Seung C Sohn
(74) *Attorney, Agent, or Firm* — Fish & Richardson P.C.

(57) ABSTRACT

A photodetector circuit is provided that includes: a first wiring connected to an input terminal; a second wiring connected to an output terminal; and first and second photosensors each including a first terminal connected to the first wiring and a second terminal connected to the second wiring, wherein the first wiring and the second wiring are arranged in parallel, and the sum of resistance values of a first path from the input terminal to the output terminal via the first wiring, the first photosensor, and the second wiring is identical to the sum of resistance values of a second path from the input terminal to the output terminal via the first wiring, the second photosensor, and the second wiring.

23 Claims, 7 Drawing Sheets

PHOTODETECTOR CIRCUIT

BACKGROUND OF THE INVENTION

1. Field of the Invention

The present invention relates to a photodetector circuit having a photosensor.

2. Description of the Related Art

Patent Document 1 discloses an area sensor and a display device having an area sensor. The area sensor includes an EL device and a photosensor for taking an image of light of the EL device reflected from a target to be detected.

REFERENCE

[Patent Document 1] Japanese Published Patent Application No. 2001-292276

SUMMARY OF THE INVENTION

In a photodetector circuit having a plurality of photosensors, if there is deviation due to parasitic resistance in a wiring for supplying power to each photosensor or a wiring for outputting an electric signal generated by each photosensor detecting the light, noise occurs due to the deviation.

One embodiment of the present invention is a photodetector circuit that includes: a first wiring connected to an input terminal; a second wiring connected to an output terminal; and first and second photosensors each including a first terminal connected to the first wiring and a second terminal connected to the second wiring, wherein the first and second wirings are disposed to be parallel to each other, and the sum of resistance values of a first path from the input terminal to the output terminal via the first wiring, the first photosensor, and the second wiring is identical to the sum of resistance values of a second path from the input terminal to the output terminal via the first wiring, the second photosensor, and the second wiring.

In the photodetector circuit with photosensors, a high-precision photodetector circuit can be achieved by reducing deviation between a reference voltage and an output signal, which is caused by parasitic resistance in the wiring.

DETAILED DESCRIPTION OF THE INVENTION

Figure 1:
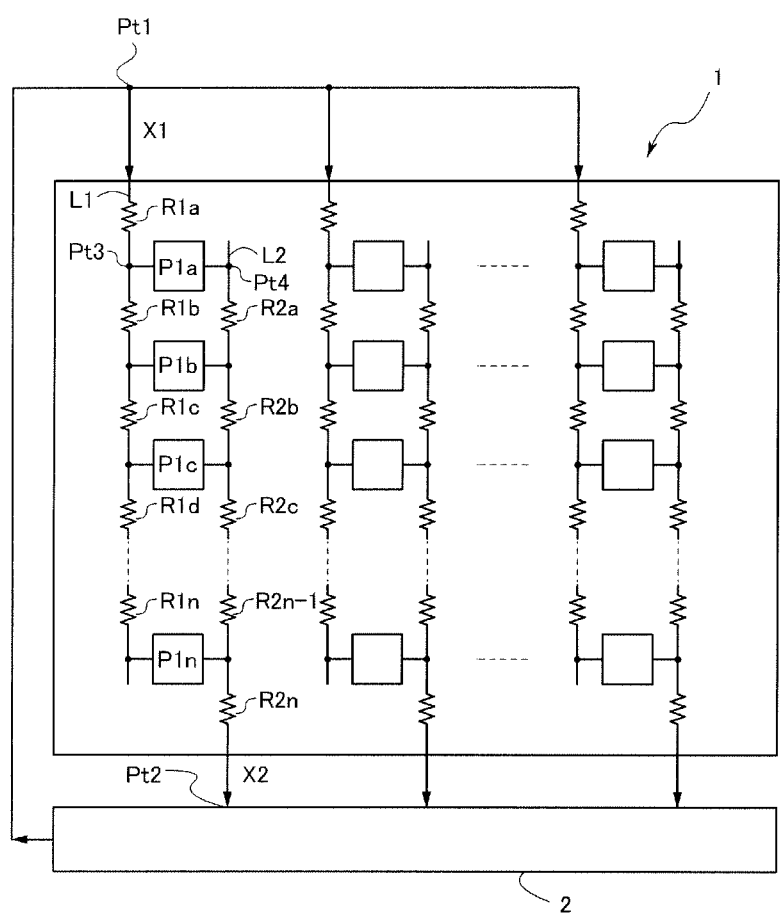
FIG. 1 is an illustration of a photodetector circuit 1.

Examples of the present invention will be described by referring to the drawings. However, the present invention is not limited to the explanations below, and various modifications may be made to its shape and details within the purport and scope of the invention.

Embodiment 1

In the present specification, the term "a photosensor" refers to a circuit having a semiconductor device converting light energy into electric energy. For example, the semiconductor device includes a device that generates a current according to the quantity of received light and a device, electric resistance of which varies according to an intensity of the received light, etc.

(Configuration of Photodetector Circuit 1)

FIG. 1 shows the constitution of a photodetector circuit 1. In the photodetector circuit 1, a plurality of photosensors are disposed in the shape of a matrix.

A reference signal line L1 supplies a reference voltage X1 to n photosensors P1a, P1b, ... P1n disposed in one column. Further, a photosensor output signal line L2 outputs an output signal X2 of the n photosensors P1a, P1b, ... P1n disposed in a column.

Here, the reference voltage X1 is supplied to the reference signal line L1 via a wiring disposed from a control circuit 2 located outside of the photodetector circuit 1 and through an input terminal Pt2 (a connection portion with the reference signal line L1).

The wiring located outside of the photodetector circuit 1 has a width larger than that of the wiring disposed inside the photodetector circuit 1 (the reference signal line L1 and the photosensor output signal line L2). Accordingly, the wiring parasitic resistance of this wiring is too low to affect signals.

Focusing on the photosensor P1a as one example, paths of the reference voltage X1 and the output signal X2 will be described below. The reference voltage X1 supplied to the reference signal line L1 is supplied to the photosensor P1a through an input terminal Pt3 of the photosensor P1a.

In the photosensor P1a, the output signal X2 is generated. This output signal X2 is supplied to the photosensor output signal line L2 through an output terminal Pt4 of the photosensor P1a.

Further, the output signal X2 is supplied to a control circuit 2 through an output terminal Pt2 (a connection portion between the control circuit 2 and the photosensor output signal line L2).

The reference voltage X1 supplied to each of the photosensors P1a, P1b, P1n is affected by a voltage drop by wiring parasitic resistances R1a, R1b, ..., R1n of the reference signal line L1. Further, the output signal X2 outputted from each of the photosensors P1a, P1b, ..., P1n is affected by a voltage drop by wiring parasitic resistances R2a, R2b, ..., R2n of the photosensor output signal line L2.

Now, the photosensor P1a will be further analyzed. The reference voltage X1 is supplied to the photosensor P1a through wiring parasitic resistance R1a of the reference signal line L1. Further, the output signal X2 is outputted from the photosensor P1a through wiring parasitic resistances R2a, R2b, ..., R2n of the photosensor output signal line L2.

Next, the photosensor P1b is further examined. The reference voltage X1 is supplied to the photosensor P1b through wiring parasitic resistances R1a and R1b of the reference signal line L1. Further, the output signal X2 is outputted from the photosensor P1b through wiring the parasitic resistances R2b, R2n of the photosensor output signal line L2.

A path of a signal supplied from the input terminal Pt1 and outputted to the output terminal Pt2 via the photosensor P1a is compared with a path of a signal supplied from the input terminal Pt1 and outputted to the output terminal Pt2 via the photosensor P1b. The two paths are different from each other in that a signal passing through P1a passes through the wiring parasitic resistance R2a whereas a signal passing through the photosensor P1b passes through the wiring parasitic resistance R1b.

A case is now considered where the same intensity of light is radiated on the photosensors P1a and P1b, and where a deviation between characteristics of the photosensors P1$a$ and P1$b$ can be disregarded. If the wiring parasitic resistances R2$a$ and R1$b$ are equal to each other, it may be understood that the sum of a voltage drop caused by wiring parasitic resistance applied to a signal outputted through the photosensor P1$a$ is identical to the sum of a voltage drop caused by a wiring parasitic resistance applied to a signal outputted through the photosensor P1$b$.

Next, a photosensor P1$c$ is analyzed. The reference voltage X1 is supplied to the photosensor P1$c$ through wiring parasitic resistances R1$a$ and R1$b$ of the reference signal line L1. Further, the output signal X2 is outputted from the photosensor P1$c$ through wiring parasitic resistances R2$c$, ..., R2$n$ of the photosensor output signal line L2.

A path of a signal supplied from the input terminal Pt1 and outputted to the output terminal Pt2 via the photosensor P1$b$ is compared with a path of a signal supplied from the input terminal Pt1 and outputted to the output terminal Pt2 via the photosensor P1$c$. The two paths are different from each other in that a signal passing through the photosensor P1$b$ passes through wiring parasitic resistance R2$b$ whereas a signal passing through the photosensor P1$c$ passes through wiring parasitic resistance R1$c$.

A case is now considered where the same intensity of light is radiated on the photosensors P1$b$ and P1$c$, and where a characteristic deviation between the photosensors P1$b$ and P1$c$ can be disregarded. If wiring parasitic resistances R2$b$ and R1$c$ are identical to each other, it may be understood that the sum of a voltage drop caused by wiring parasitic resistance applied to a signal outputted through the photosensor P1$b$ is identical to the sum of a voltage drop caused by wiring parasitic resistance applied to a signal outputted through the photosensor P1$c$.

The same consideration as indicated above is applied to all of the n photosensors P1$a$, P1$b$, ..., P1$n$ disposed in one column. If the relationships of wiring parasitic resistance R2$a$=R1$b$, R2$b$=R1$c$, R2$c$=R1$d$, ..., R2$n$−1=R1$n$ are satisfied, the sum of voltage drops applied to the reference voltage X1 supplied to each of the photosensors P1$a$, P1$b$, ..., P1$n$ is identical to the sum of voltage drops applied to the output signal X2 outputted from each of the photosensors P1$a$, P1$b$, ..., P1$n$.

In order to satisfy the relationships of wiring parasitic resistance R2$a$=R1$b$, R2$b$=R1$c$, R2$c$=R1$d$, R2$n$−1=R1$n$, for example, the reference signal line L1 and the photosensor output signal line L2 may be formed of the same conductive material or have the same wiring width. Further, arranging each photosensor with the same interval may also be adopted.

Further, in some embodiments, the expression "wiring parasitic resistance A is identical to wiring parasitic resistance B (i.e., A=B)" means not only that there is absolutely no difference in the resistance values, but also that the difference between the values of the wiring parasitic resistances is too small to affect transmitting signals.

Thus, the photodetector circuit 1 can reduce deviation between the reference voltage X1 and the output signal X2, due to wiring a parasitic resistance in a path passing through each of the n photosensors P1$a$, P1$b$, ..., P1$n$ disposed in one column. When the same configuration as above is applied to photosensors disposed in other columns, deviations between the reference voltage X1 and the output signal X2, due to wiring parasitic resistance can be reduced in every path passing through the photosensors included in the photodetector circuit 1. Thus, the photodetector circuit 1 with high precision imaging can be realized.

Comparative Example

Configuration of Photodetector Circuit 3

Figure 2:
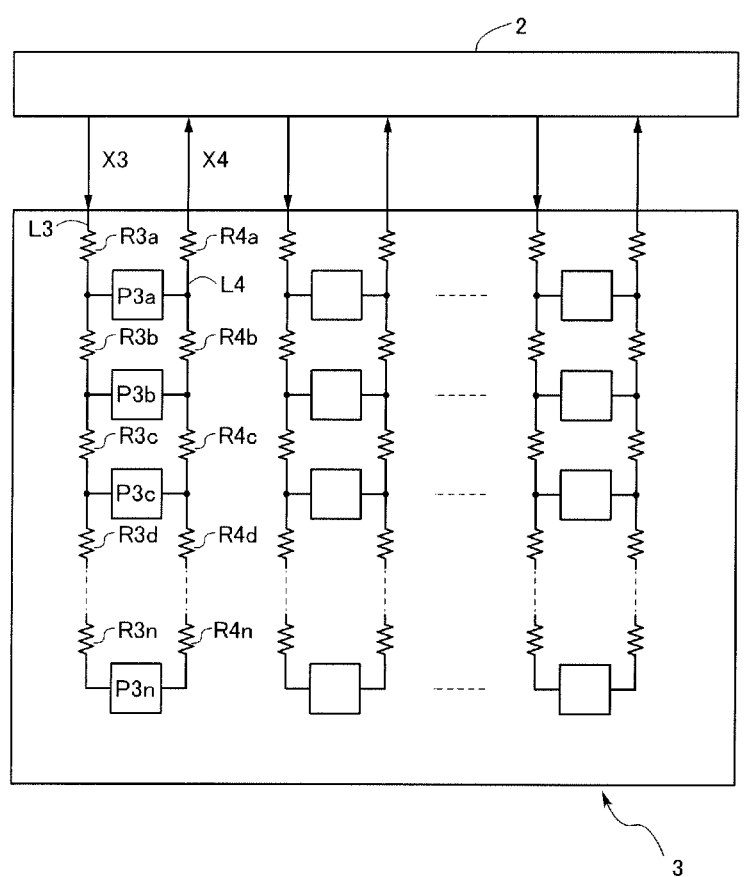
FIG. 2 is an illustration of a photodetector circuit 3.

FIG. 2 shows a photodetector circuit 3 which has a different constitution from that of the photodetector circuit 1 shown in FIG. 1. The photodetector circuit 3 is different from the photodetector circuit 1 in terms of constitution in that the direction for supplying a reference voltage X3 is opposite to the direction for outputting an output signal X4 in the photodetector circuit 3 whereas the direction for supplying the reference voltage X1 is identical to the direction for outputting the output signal X2 in the photodetector circuit 1.

First, a photosensor P3$a$ is discussed. The reference voltage X3 is supplied to the photosensor P3$a$ from a control circuit 2 through a wiring parasitic resistance R3$a$ of a reference signal line L3. Further, the output signal X4 is supplied to the control circuit 2 from the photosensor P3$a$ through a wiring parasitic resistance R4$a$ of a photosensor output signal line L4.

Next, a photosensor P3$b$ is focused on. The reference voltage X3 is supplied to the photosensor P3$b$ from the control circuit 2 through wiring parasitic resistances R3$a$ and R3$b$ of the reference signal line L3. Further, the output signal X4 is supplied to the control circuit 2 from the photosensor P3$b$ through wiring parasitic resistances R4$b$ and R4$a$ of the photosensor output signal line L4.

A path of a signal supplied from the control circuit 2 as the reference voltage X3 and then supplied to the control circuit 2 as the output signal X4 through the photosensor P3$a$ is compared with a path of a signal supplied from the control circuit 2 as the reference voltage X3 and then supplied to the control circuit 2 as the output signal X4 through the photosensor P3$b$. Because a signal passing through the photosensor P3$b$ passes through wiring parasitic resistances R3$b$ and R4$b$, the signal has a longer path than that of a signal passing through the photosensor P3$a$.

Accordingly, the signal passing through the photosensor P3$b$ is affected by a voltage drop caused by a wiring parasitic resistance more than the signal passing through the photosensor P3$a$.

As described above, in the photodetector circuit 3 shown in FIG. 2, there is a deviation between the reference voltage X3 and the output signal X4 due to a wiring parasitic resistance in a path passing through each of the n photosensors P3$a$, P3$b$, P3$n$ disposed in one column. Similarly, as for other columns of photosensors, it can be also known that a deviation exists between the reference voltage X3 and the output signal X4 due to wiring parasitic resistance in a path passing through each of all the photosensors included in the photodetector circuit 3.

Thus, in order to reduce the deviation between the reference voltage X1 and the output signal X2 due to wiring parasitic resistance, it is important that a supply source of the reference voltage X1 (e.g., input terminal Pt1) and a supply destination of the output signal X2 (e.g., output terminal Pt2) are disposed on opposite sides of the photodetector circuit 1, as shown.

Figure 7:
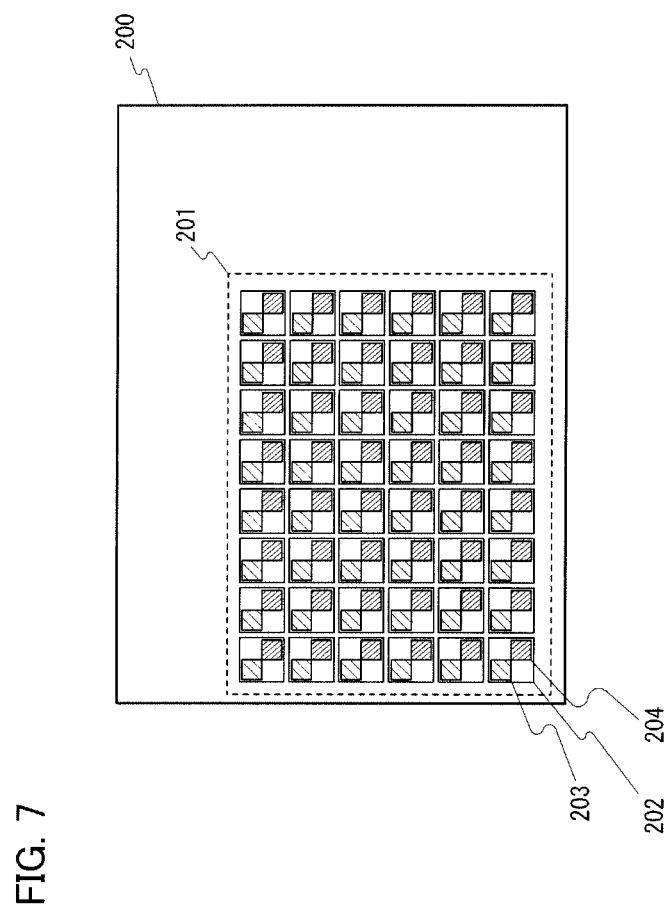
FIG. 7 is an illustration of a display device.

Further, as shown in FIG. 7, a display device 200 having a touch input function with high precision can be achieved by mounting a pixel circuit 201 in which a display element 203 and photosensor 204 are included in a pixel 202.

Embodiment 2

An example of constructing a circuit of a photosensor will be described with reference to the drawings.

(Circuit Configuration of Photosensor P10)

Figure 3A:
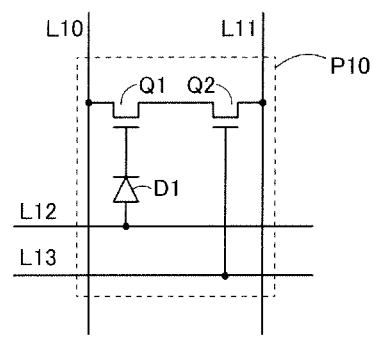
FIGS. 3A and 3B are illustrations of examples of circuit configurations of a photosensor.

The constitution of a circuit of a photosensor P10 will be described with reference to FIG. 3A. This photosensor P10 includes a photodiode D1 and transistors Q1 and Q2.

In the photodiode D1, an anode is connected to a wiring L12, and a cathode is connected to a gate of the transistor Q1.

In the transistor Q1, one of a source and a drain is connected to the reference signal line L10 and the other of the source and the drain is connected to one of a source and a drain of the transistor Q2.

In the transistor Q2, a gate is connected to a wiring L13 and the other of the source and the drain of the transistor Q2 is connected to a photosensor output signal line L11.

The transistor Q1 generates an output signal of the photosensor P10 according to the amount of electrical charge supplied from the photodiode D1. Further, the transistor Q2 is a switch for controlling the supply of an output signal generated by the transistor Q1 into the photosensor output signal line L11.

In order to prevent outputting an unnecessary voltage to the photosensor output signal line L11, it is proper to use a transistor having a small off-state current as the transistors Q1 and Q2.

Here, the off-state current of a transistor using an oxide semiconductor is very small. Thus, it is proper to use a transistor made of an oxide semiconductor as the transistors Q1 and Q2.

(Circuit Configuration of Photosensor P11)

Figure 3B:
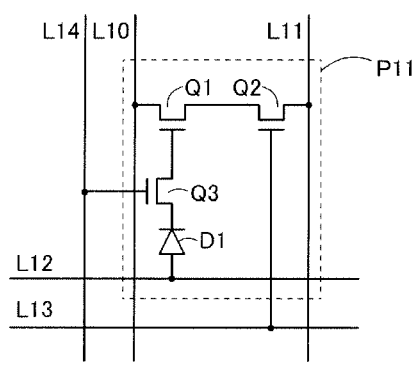

Circuit constitution of a photosensor P11 will be described with reference to FIG. 3B. This photosensor P11 includes a transistor Q3 in addition to a photosensor P10 shown in FIG. 3A.

In the transistor Q3, a gate is connected to a wiring L14, one of a source and a drain is connected to a cathode of a photodiode D1, and the other of the source and the drain is connected to a gate of a transistor Q1.

This transistor Q3 is mounted in order to maintain an electrical charge supplied from the photodiode D1 and then stored in a gate of the transistor Q1. Accordingly, it is proper to use a transistor with a small off-state current as the transistor Q3.

Here, an off-state current of a transistor using an oxide semiconductor is very small. Accordingly, it is proper to use a transistor made of an oxide semiconductor as the transistor Q3.

(Transistor Including Oxide Semiconductor)

An oxide semiconductor disclosed in this specification will be described. An oxide semiconductor used in a transistor is highly purified and electrically i-typed (intrinsic-typed) by intentionally removing impurities such as hydrogen, moisture, hydroxyl, and hydroxide (hydrogen compound), etc., which are a cause of donors, and then supplying oxygen that has been reduced simultaneously with the process of reducing the impurities. This treatment is performed to suppress change in electrical characteristics of a transistor.

Further, since photo degradation hardly occurs in a transistor using a highly purified oxide semiconductor, it is proper to be used as a transistor in a photosensor.

By removing as much hydrogen as possible from an oxide semiconductor, the density of carriers in the oxide semiconductor is less than $1\times10^{14}/cm^3$, and in some embodiments below $1\times10^{12}/cm^3$, and in other embodiments below $1\times10^{10}/cm^3$.

An oxide semiconductor, which is a wide gap semiconductor, has a low density of minority carriers, and minority carriers hardly occur in the oxide semiconductor. Therefore, a tunnel current is not easily generated, and further, an off-state current becomes smaller in a transistor using an oxide semiconductor.

Further, collision ionization and avalanche breakdown hardly occur in a transistor using an oxide semiconductor that is a wide gap semiconductor. Thus, a transistor using an oxide semiconductor is resistant to hot carrier degradation. The main reason for hot carrier degradation is that a carrier increases due to avalanche breakdown and then high speed accelerated carriers are injected into a gate insulating film.

Further, the term "an off-state current" in some embodiments refers to a current flowing between a source and a drain of an n-channel type transistor having a positive (+) threshold voltage Vth when applying any gate voltage ranging from −20 [V] to −5 [V] at a room temperature. Further, the term "a room temperature" refers to a temperature ranging from 15° C. to 25° C.

A transistor using a highly purified and electrically i-typed (intrinsic-typed) oxide semiconductor has a current of 100 [aA/μm] or less per a channel width W=1 [μm], and in some embodiments 1 [aA/μm] or less, and in other embodiments 10 [zA/μm] or less.

As described above, a transistor having a very small off-state current can be achieved by using a highly purified and electrically i-typed (intrinsic-typed) oxide semiconductor. Hereinafter, a test device (referred to as "TEG") will be manufactured, and the result of measuring off-state current characteristics obtained therefrom will be described.

In the manufactured TEG, 200 transistors, each having a ratio of channel length L to channel width W of L/W=3 [μm]/50 [μm] (film thickness d=30 [nm]), are connected in parallel to install a transistor of L/W=3 [μm]/10000 [μm].

Figure 5:
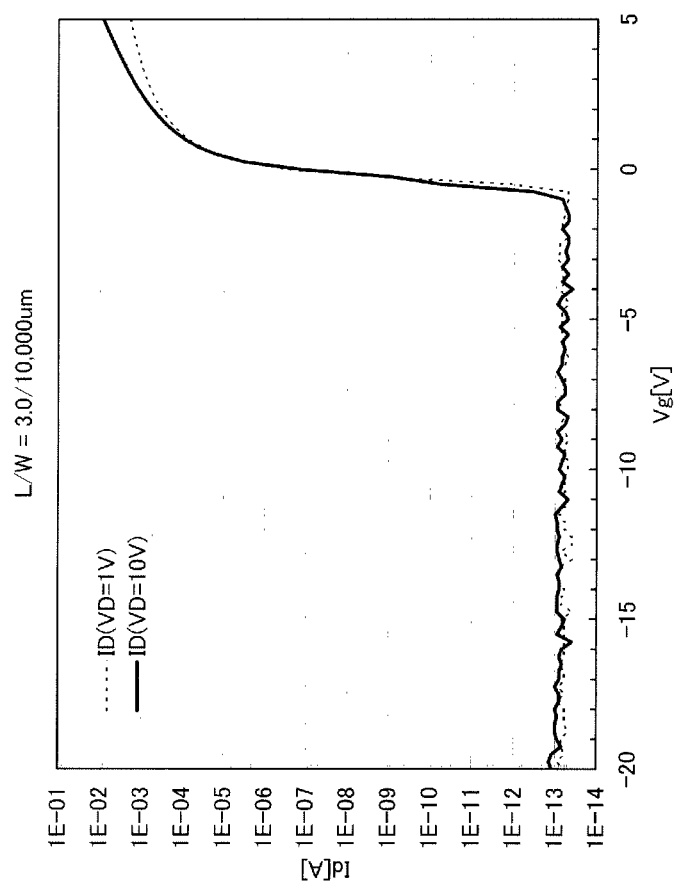
FIG. 5 is a graph showing electric characteristics of a transistor.

FIG. 5 is a graph that shows conduction characteristics [log(Id)–Vg] of the transistor installed in the TEG. In this graph, the transverse axis indicates a gate voltage value Vg [V] and the longitudinal axis indicates a drain current value Id [A]. Further, the temperature of the substrate is room temperature, and the voltage Vd between a source and a drain is 1 [V] (a broken line in the graph) or 10 V (an unbroken line in the graph). After changing the voltage Vg between the source and the drain from −20 [V] to +20 [V], a change in the source-drain current Id was measured.

As shown in FIG. 5, regardless of whether Vd is 1 [V] or 10 [V], a transistor having a channel width W of 10000 [μm] has an off-state current of $1\times10^{-13}$ [A] or less. This is less than or equal to the resolution (100 fA) of a measurement instrument (semiconductor parameter/analyzer, Agilent 4156C; made by Agilent company). This off-state current corresponds to 10 [aA/μm] when converted with a per channel width of 1 [μm].

Other examples of a circuit of a photosensor will be explained below.

(Circuit Configuration of Photosensor P12)

Figure 4A:
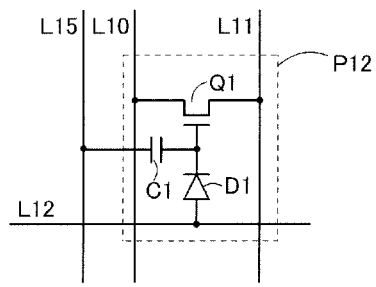
FIGS. 4A to 4C are illustrations of examples of circuit configurations of a photosensor.

Circuit construction of a photosensor P12 will be explained with reference to FIG. 4A. This photosensor P12 includes a photodiode D1, a transistor Q1, and a capacitor C1

In the photodiode D1, an anode is connected to a wiring L12, and a cathode is connected to the transistor Q1.

In the transistor Q1, one of a source and a drain is connected to the reference signal line L10, and the other of the source and the drain is connected to a photosensor output signal line L11.

In the capacitor C1, one electrode is connected to the cathode of the photodiode D1 and the other electrode is connected to a wiring L15.

(Circuit Configuration of Photosensor P13)

Figure 4B:
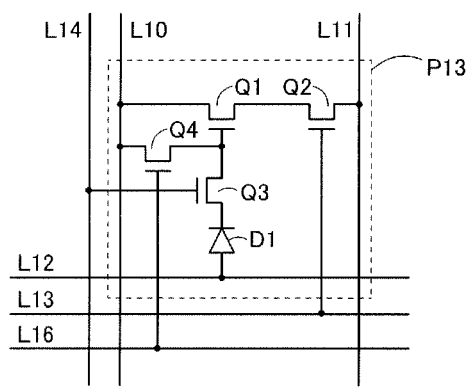

Circuit construction of a photosensor P13 will be described with reference to FIG. 4B. This photosensor P13 includes a transistor Q4 in addition to the photosensor P11 shown in FIG. 3B.

In the transistor Q4, a gate is connected to a wiring L16, one of a source and a drain is connected to the reference signal line L10, and the other of the source and the drain is connected to a gate of a transistor Q1.

The transistor Q4 is installed to supply a reset signal to the gate of the transistor Q1.

(Circuit Configuration of Photosensor P14)

Figure 4C:
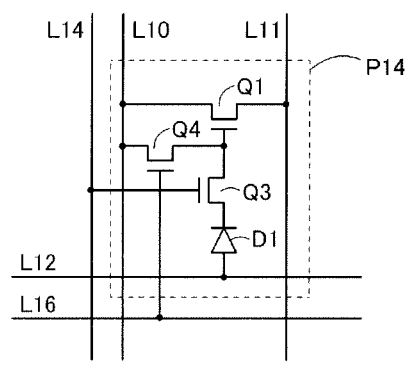

Circuit construction of photosensor P14 will be explained with reference to FIG. 4C. In this photosensor P14, a transistor Q2 is excluded from the photosensor P13 shown in FIG. 4B.

Embodiment 3

One example of a manufacturing method of a transistor using a highly purified and electrically i-typed (intrinsic-typed) oxide semiconductor will be explained with reference to FIGS. 6A to 6E.

First, an insulating layer 101 is formed as a base layer over a substrate 100. The insulating layer 101 is formed by removing residual moisture from a treatment chamber. This is to prevent hydrogen, water, hydroxyl, or hydroxide, etc. from being be included in the insulating layer 101.

Next, an oxide semiconductor layer is formed over the insulating layer 101 by sputtering. Before forming the oxide semiconductor layer, the substrate 100 with the insulating layer 101 thereover is pre-heated. This is to prevent hydrogen, moisture, and hydroxyl from being included in the oxide semiconductor layer as much as possible. Impurities such as hydrogen, moisture, etc. absorbed in the substrate 100 are removed and exhausted.

A metal oxide sputtering target comprising zinc oxide as a main element may be used as a target for an oxide semiconductor layer. For example, a target having a compositional ratio of $In_2O_3:Ga_2O_3:ZnO=1:1:1$ [molar ratio] may be used. Other than that, a target having a composition ratio of $In_2O_3:Ga_2O_3:ZnO=1:1:2$ [molar ratio] or $In_2O_3:Ga_2O_3:ZnO=1:1:4$ [molar ratio] may be used.

Further, metal oxides, such as In—Sn—Ga—Zn—O, In—Sn—Zn—O, In—Al—Zn—O, Sn—Ga—Zn—O, Al—Ga—Zn—O, Sn—Al—Zn—O, In—Zn—O, Sn—Zn—O, Zn—Mg—O, Sn—Mg—O, In—Mg—O, In—O, Sn—O, Zn—O, etc., may be used as a target.

Further, a thin film represented as $InMO_3(ZnO)_m$ (m>0) may be used as an oxide semiconductor layer. Here, M is one or more metal element selected from Ga, Al, Mn, and Co. For example, Ga, Ga and Al, Ga and Mn, or Ga and Co may be used as M.

Figure 6A:
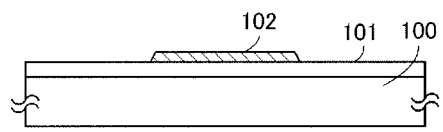
FIGS. 6A to 6E are illustrations showing an example of manufacturing a transistor.

The formed oxide semiconductor layer is transformed into an island-shaped oxide semiconductor layer 102 by a first photolithography process (FIG. 6A). Then, in order to remove hydrogen, water, and hydroxy, etc. from the oxide semiconductor layer 102, the substrate is introduced into an electric furnace and heated under nitrogen atmosphere. This heat treatment provides the oxide semiconductor layer 102 with the effects of dehydration and dehydrogenation.

A temperature for performing the heat treatment is from 400° C. to 750° C., and in some embodiments equal to or above 400° C. and below a strain point of a substrate. Further, the heat treatment is performed under an atmosphere that does not include water, hydrogen, etc.

After the heat treatment, the oxide semiconductor layer is heated under an oxygen atmosphere or an atmosphere containing nitrogen and oxygen (e.g., a volume ratio of nitrogen:oxygen=4:1). This is to repair oxygen vacancies, which occur in the oxide semiconductor layer 102.

Figure 6B:
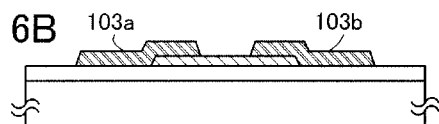

Then, a first electrode 103a and a second electrode 103b are formed over the insulating layer 101 and the oxide semiconductor layer 102 (FIG. 6B). The first electrode 103a functions as one of a source electrode and a drain electrode. The second electrode 103b functions as the other of the source electrode and the drain electrode.

Figure 6C:
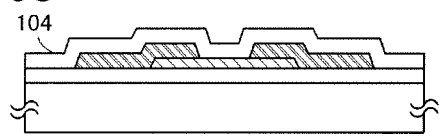

Next, a gate insulating layer 104 is formed over the insulating layer 101, the oxide semiconductor layer 102, the first electrode 103a, and the second electrode 103b (FIG. 6C). Further, hydrogen is not included in an atmosphere under which the gate insulating layer 104 is formed.

Figure 6D:
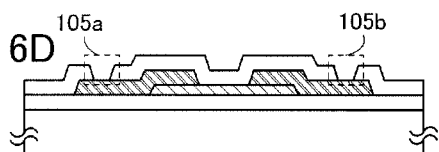

Next, openings 105a and 105b reaching the first electrode 103a and the second electrode 103b are formed by removing a portion of the gate insulating layer 104 (FIG. 6D).

Figure 6E:
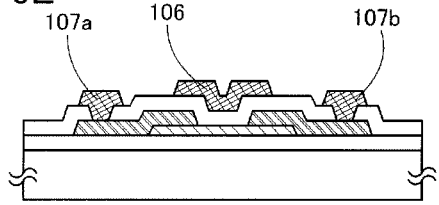

Then, a gate electrode 106, a first wiring 107a, and a second wiring 107b are formed over the gate insulating layer 104 and the openings (105a and 105b) (FIG. 6E).

As described above, a transistor using a highly purified and electrically i-typed (intrinsic-typed) oxide semiconductor can be manufactured.

This application is based on Japanese Patent Application serial no. 2010-034156 filed with Japan Patent Office on Feb. 19, 2010, the entire contents of which are hereby incorporated by reference.

What is claimed is:

1. A semiconductor device having a photodetector circuit, the photodetector circuit comprising:
a first wiring directly connected to an input terminal;
a second wiring directly connected to an output terminal; and
first and second photosensors each including a first terminal directly connected to the first wiring and a second terminal directly connected to the second wiring,
wherein the first wiring and the second wiring are arranged in parallel, and
wherein the sum of resistance values of a first path from the input terminal to the output terminal via the first wiring, the first photosensor, and the second wiring is identical to the sum of resistance values of a second path from the input terminal to the output terminal via the first wiring, the second photosensor, and the second wiring.

2. The semiconductor device according to claim 1, wherein the first wiring and the second wiring are formed of a same conductive material and have a same width.

3. The semiconductor device according to claim 1, wherein the input terminal and the output terminal are connected to a control circuit.

4. The semiconductor device according to claim 2, wherein the input terminal and the output terminal are connected to a control circuit.

5. The semiconductor device according to claim 1, wherein each of the first and second photosensors includes a thin film transistor comprising an oxide semiconductor layer.

6. The semiconductor device according to claim 5, wherein the oxide semiconductor layer is a film represented as $InMO_3(ZnO)_m$ (m>0, m is one or more metal element selected from Ga, Al, Mn, and Co).

7. A semiconductor device having a photodetector circuit, the photodetector circuit comprising:
a plurality of photosensors arranged in a first direction, each including a first terminal and a second terminal;

a first wiring extending from an input terminal in the first direction, the first wiring directly connected to the first terminal of each of the plurality of photosensors; and a second wiring extending to an output terminal in the first direction, the second wiring directly connected to the second terminal of each of the plurality of photosensors, wherein the input terminal and the output terminal are disposed in opposition to each other with the plurality of photosensors interposed therebetween.

8. The semiconductor device according to claim 7, wherein the sum of resistance values of a first path from the input terminal to the output terminal via the first wiring, a first one of the plurality of photosensors, and the second wiring is identical to the sum of resistance values of a second path from the input terminal to the output terminal via the first wiring, a second one of the plurality of photosensors, and the second wiring.

9. The semiconductor device according to claim 7, wherein the first wiring and the second wiring are formed of a same conductive material and have a same width.

10. The semiconductor device according to claim 7, wherein the input terminal and the output terminal are connected to a control circuit.

11. The semiconductor device according to claim 9, wherein the input terminal and the output terminal are connected to a control circuit.

12. The semiconductor device according to claim 7, wherein each of the plurality of photosensors includes a thin film transistor comprising an oxide semiconductor layer.

13. The semiconductor device according to claim 12, wherein the oxide semiconductor layer is a film represented as $InMO_3(ZnO)_m$ (m>0, m is one or more metal element selected from Ga, Al, Mn, and Co).

14. A semiconductor device having a photodetector circuit, the photodetector circuit comprising:
 a plurality of photosensors, each including a first terminal and a second terminal;
 a first wiring configured to supply a voltage from an input terminal in a first direction, the first wiring directly connected to the first terminal of each of the plurality of photosensors; and
 a second wiring configured to output a signal from to the second terminal in the first direction, the second wiring directly connected to the second terminal of each of the plurality of photosensors to an output terminal,
 wherein the input terminal and the output terminal are disposed on opposite sides of the photodetector circuit.

15. The semiconductor device according to claim 14, wherein the sum of resistance values of a first path from the input terminal to the output terminal via the first wiring, a first one of the plurality of photosensors, and the second wiring is identical to the sum of resistance values of a second path from the input terminal to the output terminal via the first wiring, a second one of the plurality of photosensors, and the second wiring.

16. The semiconductor device according to claim 14, wherein the first wiring and the second wiring are formed of a same conductive material and have a same width.

17. The semiconductor device according to claim 14, wherein the input terminal and the output terminal are connected to a control circuit.

18. The semiconductor device according to claim 16, wherein the input terminal and the output terminal are connected to a control circuit.

19. The semiconductor device according to claim 14, wherein each of the plurality of photosensors includes a thin film transistor comprising an oxide semiconductor layer.

20. The semiconductor device according to claim 19, wherein the oxide semiconductor layer is a film represented as $InMO_3(ZnO)_m$ (m>0, m is one or more metal element selected from Ga, Al, Mn, and Co).

21. The semiconductor device according to claim 1, wherein the first wiring is not directly connected to the output terminal, and the second wiring is not directly connected to the input terminal.

22. The semiconductor device according to claim 1, wherein the first wiring is not directly connected to the output terminal, and the second wiring is not directly connected to the input terminal.

23. The semiconductor device according to claim 1, wherein the first wiring is not directly connected to the output terminal, and the second wiring is not directly connected to the input terminal.

* * * * *